United States Patent [19]

Sequin

[11] 4,075,514

[45] Feb. 21, 1978

[54] SENSING CIRCUIT FOR SEMICONDUCTOR CHARGE TRANSFER DEVICES

[75] Inventor: Carlo Heinrich Sequin, Berkeley, Calif.

[73] Assignee: Bell Telephone Laboratories, Incorporated, Murray Hill, N.J.

[21] Appl. No.: 747,900

[22] Filed: Dec. 6, 1976

[51] Int. Cl.² .............................................. H03K 5/20
[52] U.S. Cl. .............................. 307/355; 307/221 D; 333/70 T
[58] Field of Search ................... 307/230, 221 D, 356, 307/355; 333/70 T

[56] References Cited

U.S. PATENT DOCUMENTS

| 3,389,340 | 6/1968 | Forbes | 307/230 |
|---|---|---|---|
| 3,809,923 | 5/1974 | Esser | 333/70 T |
| 3,867,645 | 2/1975 | Weimer | 307/221 D |
| 3,969,636 | 7/1976 | Baertsch | 307/221 D |

OTHER PUBLICATIONS

IEEE Transactions, Feb. 1976, pp. 133-141, "The Design and Operation of Practical Charge-Transfer Transversal Filters", by Baertsch et al.

*Primary Examiner*—John S. Heyman
*Attorney, Agent, or Firm*—D. Caplan

[57] ABSTRACT

A sensing circuit is disclosed for detecting and amplifying the output signal of a semiconductor charge transfer device, particularly of the transversal filter type containing sensing split-electrodes for sensing the charge packets being transferred through the device. The circuit includes two amplifier means, one of which suppresses the (useless) common mode signal and the other of which detects the (useful) difference signal of the split-electrodes. In addition, the sensing circuit is provided both with "reset" switching means for eliminating spurious signals due to stray charges that accumulate on the sensing electrodes and with "clamping" switching means for eliminating noise of the kTC type generated by the "reset" switching.

26 Claims, 5 Drawing Figures

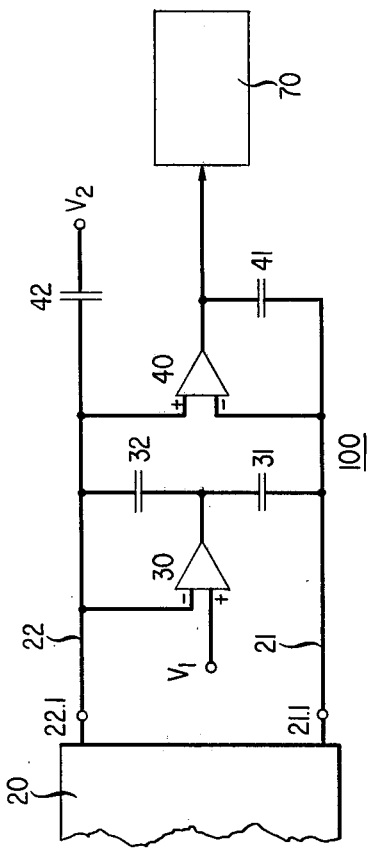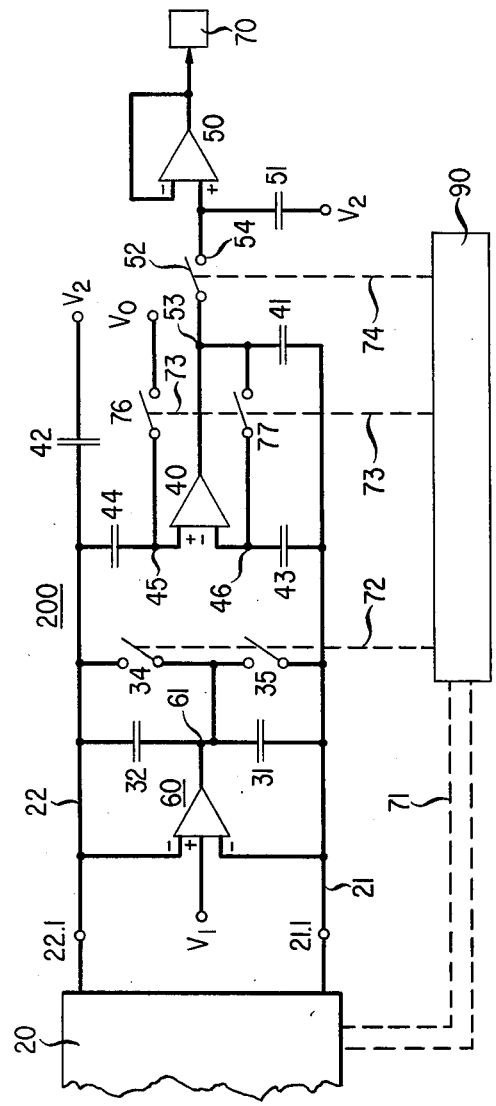

SENSING CIRCUIT FOR SEMICONDUCTOR CHARGE TRANSFER DEVICES

FIELD OF THE INVENTION

This invention relates to the field of semiconductor apparatus, and more particularly to electrical circuits for sensing the output of semiconductor charge transfer devices.

BACKGROUND OF THE INVENTION

Semiconductor charge transfer devices generally are of two basic types: charge coupled devices (CCD) and bucket brigade devices (BBD). Either of these types can be used for transfer of charge packets and can be built in the form of a transversal filter device, that is, a tapped delay line configuration with suitably weighted outputs. Such a filter device contains many stages, typically of the order of 10 or more, each stage containing a split-electrode having two electrode segments for sensing the charge packet in that stage. Typically, the lengths ($l_1$ and $l_2$) of the two segments of such a split-electrode pair in a given stage are characterized by a ratio, $r = l_1/l_2$, in accordance with a predetermined tap weight for that stage; whereas the sum of the lengths ($l_1 + l_2$) of the two segments of a split-electrode pair is the same for all such split-electrode pairs, corresponding to the width of the charge transfer channel. The effective tap weight $r_i$ of that stage is then given by: $r_i = (l_1 - l_2)/(l_1 + l_2)$. One electrode segment ($l_1$) of every split-electrode is ohmically connected to a first common output terminal for the charge transfer device, and the other electrode segment ($l_2$) of every split-electrode is ohmically connected to a second common output terminal for the charge transfer device. For convenience of description, all the electrode segments that are connected to the first common output terminal are referred to as forming the "first set" of sense electrodes, and all the electrode segments that are connected to the second common output terminal are referred to as forming the "second set" of sense electrodes. During operation of such a charge transfer device of the split-electrode type, there will be a sequence of periodic time intervals (or time slots) during which each of these split-electrode segments is sensitive to the corresponding underlying charge packet in the semiconductor by reason of induced electrical image charges, so that signals ($S_1$ and $S_2$) are periodically developed at the output terminals respectively of the first and second set of electrodes, each such signal being proportional to the sum of the various charge packets underlying all the various electrodes in that set, with each such packet multiplied by the corresponding tap weight. The desired output signal of the device is then the sequence of instantaneous differences between the signals periodically developed during the aforementioned time slots at the two output terminals; that is, the desired (difference mode) output signal ($S_1-S_2$) for a given time slot is proportional to:

$$\Sigma Q_i(1 + r_i)/2 - \Sigma Q_i(1 - r_i)/2 = \Sigma Q_i r_i \quad (1)$$

wherein $r_i$ is the effective tap weight of the split-electrode pair of the i'th stage, and $Q_i$ is the charge packet in the i'th stage during the given time slot.

In order for a transversal filter to function properly, it is important that there be a substantially linear relationship between the input signal and the corresponding output signal. In the semiconductor charge transfer device operating as a transversal filter, it is thus important to have a linear relationship not only between charge packet and corresponding input signal but also between charge packet and corresponding output signal. However, the voltage on a sense electrode in a charge transfer device has an important influence on the width of the depletion layer in the semiconductor underlying the electrode; hence, the voltage on a sense electrode has an important influence on the "image" charge induced on the sense electrode by an underlying charge packet in the semiconductor, because of the tendency of every charge packet to image a portion of its charge into the semiconductor substrate across the depletion layer (rather than into the sense electrode) depending upon the local depletion layer width (and hence upon depletion layer capacitance). Since the voltage on a given sense electrode in one set of sense electrodes depends upon the charge induced by the various charge packets underlying all the other electrodes in that set, the charge packets underlying all these other electrodes undesirably influence the "image" charge induced by any charge packet underlying the given electrode. Thus, the relationship of the charge packet in a given stage to the "image" charge induced on the overlying electrode is distorted from the ideal value, that is, the output signal is not the desired value because the output is not proportional to the display of Eq. (1). This undesirable phenomenon is called "crosstalk" and causes distortion of the output signal.

A measure of the overall distortion in the output signal at a given moment of time caused by the effects of "crosstalk" is the sum total of all the charges instantaneously present in all the charge packets in the transversal filter device. This sum total of all the charges is reflected in the common mode signal ($S_1 + S_2$) on the two sets of electrodes:

$$\Sigma Q_i(1 + r_i)/2 + \Sigma Q_i(1 - r_i)/2 = \Sigma Q_i \quad (2)$$

This common mode signal ordinarily is large compared with the desired difference mode signal, and thus the detection process is made difficult by reason of the need for detecting the relatively small difference signal (Eq. 1) in the presence of a relatively large common mode signal (Eq. 2). R. D. Baertsch et al., in a paper entitled "The Design and Operation of Practical Charge-Transfer Transversal Filters" published in *IEEE Transactions on Electron Devices*, Vol. ED-23, No. 2, pp. 133–141 (February, 1976), have disclosed detection circuits for a CCD transversal filter. However, in all those circuits the difference mode signal is detected by an amplifier which must also handle the common mode signal, thereby necessitating costly and cumbersome circuit elements and configurations. Accordingly, it is desirable to suppress the distortion caused by the common mode signal in a semiconductor transversal filter device by less costly means than in the prior art.

SUMMARY OF THE INVENTION

In order to suppress the distortion due to common mode signal in a split-electrode semiconductor charge transfer transversal filter device, the two sets of sense (split) electrodes in the device are maintained at a fixed predetermined voltage level during all times when output signal is detected. More specifically, each of a pair of amplifier means ($A_1$ and $A_2$) for detecting, respectively, the common mode and the difference mode output signal of the transversal filter, is provided with feedback means to suppress during all detection time intervals any voltage variations on the sense electrodes caused both by common mode signal and by difference mode signal. Thus, at the moments of detection of the desired output signal of the filter, both sets of electrodes are at the same potential as determined by a fixed D.C. reference source, $V_1$. Typically, $A_1$ and $A_2$ are operational amplifiers, each amplifier having at least one positive summing input terminal and one negative summing input terminal. Advantageously, the amplifier $A_1$ has two negative summing input terminals each of which is connected to a different one of the sense electrode sets, while the positive summing input terminal of $A_1$ is for connection to $V_1$. Advantageously, also, the amplifier means $A_1$ includes a pair of feedback capacitors of substantially equal capacitances, each capacitor connected between an output terminal of this amplifier and a different set of electrodes, each capacitor having a capacitance of the same order of magnitude as one-half the sum of the capacitances of all the sense electrodes of both sets. On the other hand, the amplifier means $A_2$ is arranged for detecting the desired difference mode output signal $(S_1 - S_2)$ of the split-electrode transversal filter during suitable periodic time intervals. Moreover, advantageously the amplifier $A_2$ has an output terminal connected to a terminal of a capacitor whose other terminal is connected (for feedback) to one of the sets of sense electrodes. In this way, the output of the amplifier $A_2$ is a useful representation of the desired output signal of the semiconductor transversal filter device, the distortion due to nonlinearity of sense electrode capacitances (caused by both common mode and difference mode signal) thereby being suppressed.

In a specific embodiment of the invention, a split-electrode CCD has a pair of output sense terminals, each connected to a different one of two sets of sense electrodes, each set including one of the electrodes of every pair of split-electrodes in the CCD. At least one of these output sense terminals is connected to a negative summing input terminal of a first amplifier ($A_1$). This first amplifier $A_1$ has a positive summing input terminal for connection to a D.C. source, advantageously the same D.C. source as is used for controlling the potential of one of the transfer electrodes in an input stage of the CCD. An output terminal of the first amplifier is connected for negative feedback through a separate one of a pair of feedback capacitors back to each of the output sense electrodes of the CCD. It is important, for eliminating as much common mode signal as possible, that the capacitances of these feedback capacitors be as nearly equal as possible ("substantially equal"), typically to within about 0.1% for about 60 dB common mode suppression; that is, although the absolute value of their capacitances is not crucial, it is important that the ratio of their capacitances be equal to unity to within the tolerable common mode background in the desired output. Thereby, the first amplifier suppresses common mode signals on these output sense electrodes during operation of the CCD, by reason of the resulting negative feedback through the pair of feedback capacitors. In order to detect the difference mode signal on these output sense electrodes, each of the output sense terminals of the CCD is further connected to a different one of a pair of input terminals of opposite summing polarity of a second amplifier. This second amplifier's output terminal is connected to a utilization means for using the desired output signal of the CCD. In addition, in order to suppress the change in voltage on the sense electrodes caused by difference mode signals, the output terminal of the second amplifier is connected for negative feedback through another capacitor back to one of the output sense terminals of the CCD, and the other of the output sense terminals is connected through yet another capacitor to a terminal for connection thereto of a second D. C. potential source (which can be ground potential). Thus, during operation, all the sense electrodes of both sets in the CCD are restored to the same potential whenever signal is sensed, thereby eliminating both common mode and difference mode distortion otherwise caused by variation in width of the depletion region of the semiconductor underneath each sense electrode.

BRIEF DESCRIPTION OF THE DRAWINGS

This invention, together with its features, advantages, and objects, can be better understood from the following detailed description when read in conjunction with the drawings in which:

FIG. 1 is a schematic electrical diagram of a circuit for sensing the output of a semiconductor charge transfer device, in accordance with a specific embodiment of the invention;

FIG. 2 is a schematic electrical diagram of a circuit for sensing the output of a semiconductor charge transfer device in accordance with another specific embodiment of the invention;

DETAILED DESCRIPTION

Figure 3:
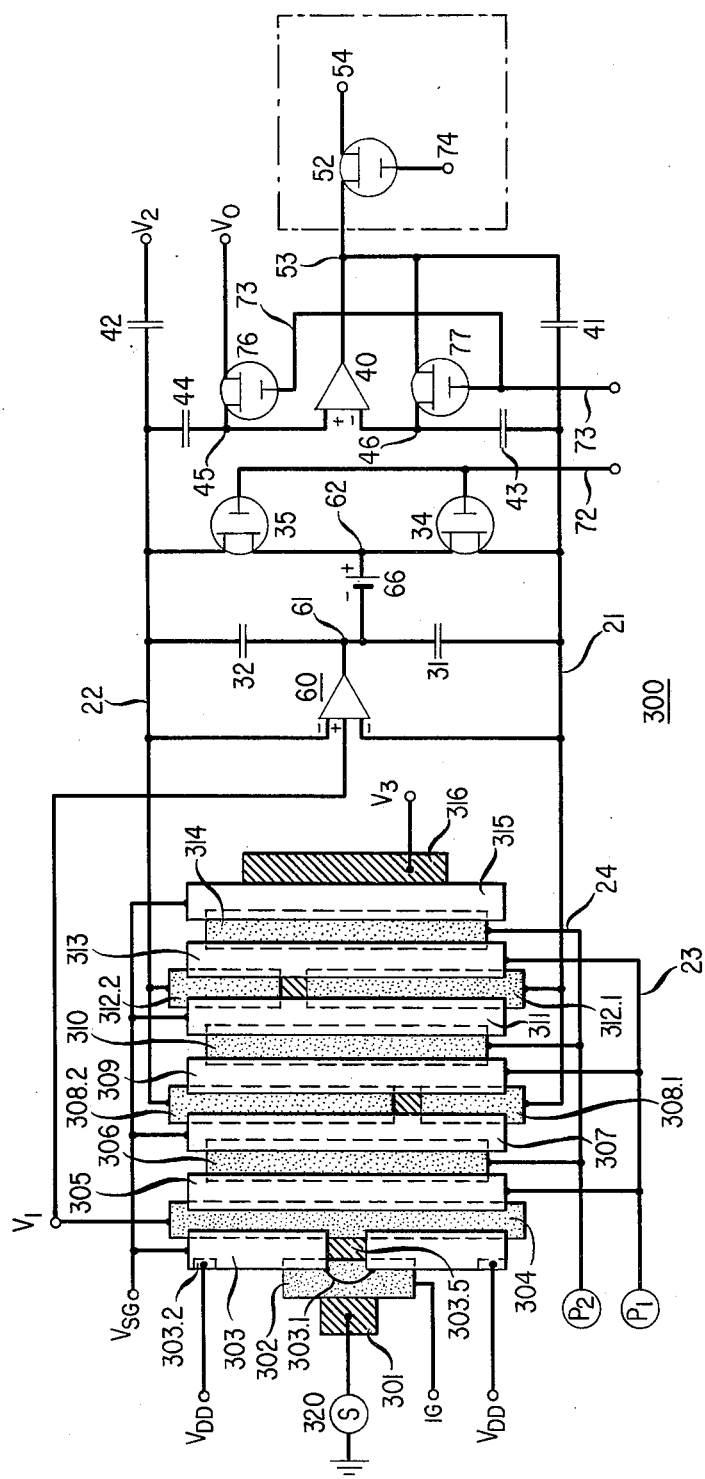
FIG. 3 is a partly schematic, partly pictorial electrical diagram of a semiconductor charge transfer device, together with a circuit for sensing the output of the device, in accordance with yet another specific embodiment of the invention.

FIG. 1 shows a circuit 100 for sensing the output of a semiconductor charge coupled device (CCD) 20. This output is in the form of electrical voltages on output terminals 21.1 and 22.1, each of which is connected to a different set of sense (or "detection") electrodes, each detection electrode typically of the CCD split-electrode configuration as known in the art. These terminals 21.1 and 22.1 are connected respectively to bus lines 21 and 22, respectively. The difference in the image charges on lines 21 and 22 at times during which the charge packets in the CCD 20 are present underneath the CCD split-electrodes (i.e., the sense electrodes, as opposed to other CCD transfer electrodes) is the desired output signal. The common mode signal on the lines 21 and 22 is suppressed with the aid of an amplifier means 30, one of whose input terminals (a positive summing terminal) is connected to a fixed (D.C.) voltage source $V_1$ and the other of whose input terminals (a negative summing terminal) is connected to the output line 22. The output terminal of this amplifier 30 is connected through feedback capacitors 31 and 32, respectively, back to the output lines 21 and 22. For the purpose of suppressing common mode signal, it is important that the capacitances of capacitors 31 and 32 be made as nearly equal as possible as mentioned above. In addition, these capacitances should be selected so as to match the maximum signal at the output terminal of the amplifier 30 (generated in response to the maximum signal of the CCD) to the signal handling capacity of the amplifier 30. On the other hand, for detection of the difference mode signal, a difference amplifier means 40 has one of its input terminals (the positive summing terminal of the amplifier 40) connected to the line 22, and the other of its input terminals (negative summing terminal of the amplifier 40) is connected to line 21. Moreover, a feedback coupling capacitor 41, coupling the output terminal of the difference amplifier 40 to the output line 21, serves as an integrating capacitor of the difference signal sensed by this difference amplifier 40; whereas capacitor 42 couples the output line 22 to a fixed voltage source $V_2$. The capacitors 41 and 42 are selected so that the amplifier 40 can accommodate the largest expected difference signal. Thus, the capacitors 41 and 42 are ordinarily rather small in comparison to the capacitors 31 and 32. An output terminal of the amplifier 40 is connected to a utilization means 70 for detecting and using the output of this amplifier.

During operation with the circuit shown in FIG. 1, the relatively large common mode signal of the sense electrodes is suppressed by the amplifier 30 acting through the feedback capacitors 31 and 32. Thereby the voltage level of all the sense electrodes on line 22 is restored to the fixed level of $V_1$. The voltage on line 21, on the other hand, is restored to the voltage on line 22 by virtue of the feedback signal output of the difference amplifier 40 acting through the feedback capacitor 41. Thus, the voltage on line 21 is also restored to the fixed level of $V_1$; hence, the detection process of the charge packets in the CCD occurs at a fixed operating point of the detection circuit. The difference signal is effectively integrated by the capacitor 41, and is available for utilization at the output terminal of the difference amplifier 40. It should be understood that sample and hold may be incorporated in the utilization means 70, which sample the output signal during the appropriate time slots suitable for detecting charge under the sense electrodes of the CCD, and which hold that value of output signal until the next sample is taken, thereby affording a smoother output signal.

On the other hand, it should be noted in conjunction with the circuit 100 of FIG. 1, that because of thermal or other noise in the CCD system, significant but spurious charge differences can build up in the (floating) CCD detection electrodes over a period of time of the order of an hour or so. In order to suppress the corresponding spurious output signal, it is desirable to take suitable measures, such as periodically short-circuiting the output line 21 to the output line 22. Such measures are automatically taken in the sensing circuit 200 shown in FIG. 2.

Figure 4:
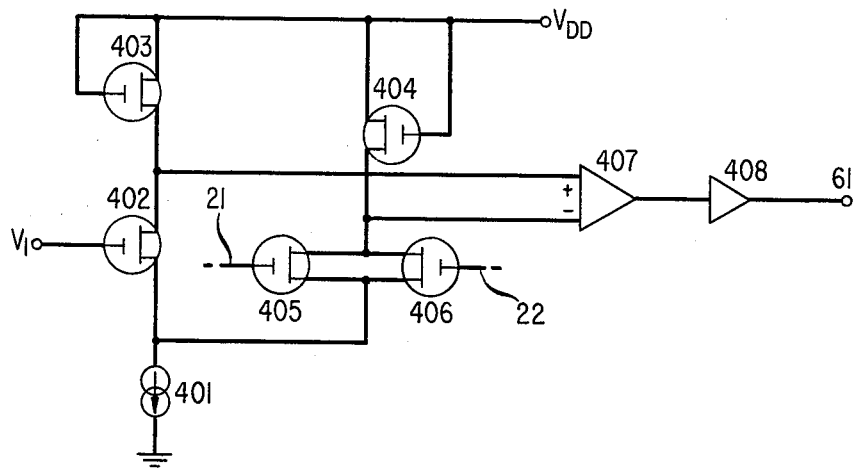
FIG. 4 is an electrical circuit diagram of an amplifier useful in the circuits shown in FIGS. 2 and 3.

As shown in FIG. 2, the sensing circuit 200 contains many elements that are substantially identical with those previously described in the foregoing description of FIG. 1, and accordingly these elements are labelled with the same reference numerals. The sensing circuit 200 includes an amplifier means 60 having three input terminals, such that the output of this amplifier is proportional to $V_1 - 1/2 (V_{22} + V_{21})$, where $V_{21}$ and $V_{22}$ are the potentials of the output lines 21 and 22, respectively. Thus, the amplifier means 60 affords a more nearly ideal common mode suppressor, since it tends to reset the sense electrodes such that the arithmetic mean of their potentials is restored to the fixed level $V_1$. A typical circuit for such an amplifier means is shown in FIG. 4, which is described in greater detail below. A control circuit 90 furnishes operating voltages (such as the clock pulses) for the CCD 20 through electrical leads 71 and controls the electrical switching elements (typically IGFETS) 34, 35, 76, 77, and 52 through electrical leads 72, 73, and 74 (indicated by dotted lines). Switching elements 34 and 35 periodically are closed during "reset" intervals in order to neutralize the stray charges. Capacitors 43 and 44 are for the purpose of correlated double sampling, described more fully below, in order to suppress "reset" noise caused by the switching of the switching elements 34 and 35, that is, the well-known kTC noise ($k$ = Boltzmann's constant; T = absolute temperature; C = capacitance, mainly of the split-electrodes). The capacitors 43 and 44 should be large enough to hold the input voltages to the difference amplifier 40 reasonably constant even in the presence of switching transients ("spikes") caused by capacitive feedthrough of switching elements 76 and 77. Typical values of the capacitors 43 and 44 are of the order of 3 picofarad, and these capacitors are made equal to within a few percent. Switching element 76 is for the purpose of clamping the voltage (both during the reset process of switching elements 34 and 35 and for a short time thereafter) at node 45 to $V_0$, as part of the correlated double sampling process described more fully below. Similarly, the switching element 77, when closed, forms a feedback loop around the difference amplifier 40 and thus enables the restoration of the voltage at node 46 to $V_0$. Switching element 52 periodically enables delivery of the output signal to an output amplifier 50 for delivering the desired output signal to the utilization means 70. A capacitor 51 serves to smooth out this output, in a conventional "sample and hold" configuration.

FIG. 3 shows a sensing circuit 300 for detecting the output of a CCD which is shown in some detail. For the sake of clarity, only the electrodes overlying the insulating layer are indicated together with shaded areas indicative of underlying diffused semiconductor regions. For an N-channel CCD, these shaded regions are of N+ (strongly N) type electrical conductivity in the semiconductor, owing to an excess of significant donor impurities in the otherwise P-type semiconductor, typically an excess of phosphorous impurities in silicon. It should be understood that the CCD and the sensing circuit 300 are both advantageously integrated in a single monocrystalline silicon substrate. Many of the elements of FIGS. 2 and 3 are substantially identical, and therefore these elements are labelled with the same reference numerals.

More specifically, the CCD of FIG. 3 includes several overlying electrodes: an input gate electrode 302; a split shield gate electrode 303, having a pair of segments connected together by a conductive wire or electrode 303.1; shield gate electrodes 307, 311, and 315; first clock phase ($P_1$) driven electrodes 305, 309, and 313; second clock phase ($P_2$) driven electrodes 306, 310, and 314; and a metering electrode 304 controlled by the fixed (D.C.) voltage source $V_1$. The shield electrodes 303, 307, 311, and 315 are maintained at a fixed potential $V_{SG}$. As known in the art, every electrode is separated from a major surface of an underlying semiconductor medium (not shown only for purpose of clarity in the drawing) by an oxide layer, typically silicon dioxide on the single crystal silicon substrate medium. The CCD also includes several impurity regions (typically diffused or implanted): input diode region 301; shield gate region 303.5, located between the split shield gate electrode 303; and charge packet sink region 316. In addition, as an optional feature, adjacent to one or both segments of the split shield gate electrode 303, an N+ impurity region 303.2 connected to a high positive voltage $V_{DD}$ can serve (just after transfer of charge to the semiconductor region underlying electrode 303) to drain off any possible excess charges which may otherwise accumulate under the shield gate electrode 303. The shaded areas representing diffused semiconductor zones between split-electrodes 308.1, 308.2, and 312.1, 312.2 are present by reason of the lack of any mask against their formation during the "self-aligned" introduction of impurities to form the other N+ regions; but these N+ regions between the split-electrodes in the body of the CCD do not materially affect operation. The amplifier 60 is provided with a second output terminal 62 which produces a D.C. shifted output signal, symbolically indicated in FIG. 3 by a fixed D.C. voltage source 66. This source is inserted between the output terminal 61 and the switching elements 34 and 35 for the purpose of putting the operating point of the amplifier output at terminal 61 at a less positive value, in order to obtain a larger linear dynamic range for this amplifier 60 in responding to the negative-going signals on the output lines 21 and 22.

Figure 5:
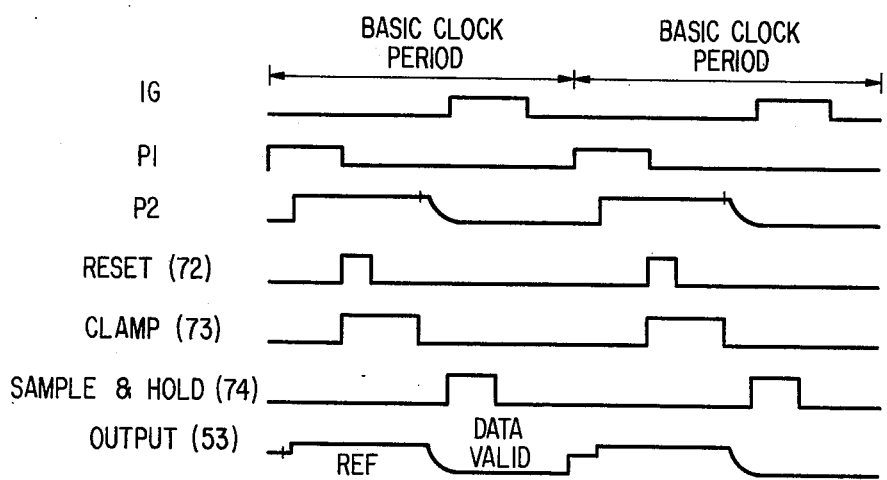
FIG. 5 is a diagram of the timing for various applied voltages useful in operating the circuits shown in FIGS. 2 and 3.

During operation, a signal source 320 controls the potential of the input diode 301. The voltage on the input gate electrode 302 periodically allows charge in accordance with this signal to flow from the input diode region through the shield gate region 303.5 to the semiconductor region underneath the metering electrode 304. Specifically, this flow can occur during the positive-going pulse phases of the input gate IG (FIG. 5). The charge is then trapped under the metering electrode as soon as the IG pulse terminates and it is this charge which is thus metered out by the metering electrode 304 for transfer to the remainder of the CCD, in accordance with the thus sampled signal. As soon thereafter as the positive-going pulse of $P_1$ is delivered to the electrode 305, the thus metered charge packet is transferred to the semiconductor region underlying said electrode 305. Thereafter, when the next positive-going pulse is delivered by $P_2$ to the electrode 306, this charge packet is transferred to the semiconductor region underlying this electrode 306. Thereafter, when the positive pulse on $P_2$ ceases, the charge packet is transferred through the semiconductor region underlying the shield gate electrode 307 to the semiconductor region underlying the pair of split-electrodes 308.1 and 308.2; at which time the desired output signal from the charge packet begins to be communicated, by way of electrical image charge on the split-electrodes, to the respective output lines 21 and 22. It is at this time when the switch 52 is closed (FIG. 5) in order to sample these outputs. This switch 52 is opened before the next positive-going $P_1$ pulse transfers the charge packets underlying the split-electrodes 308.1 and 308.2 to the region of semiconductor underlying the electrode 309 (controlled by $P_1$). It should be understood, of course, that while switch 52 remains closed, the output lines 21 and 22 are also sensitive to the other charge packets (if any) then underlying the other split-electrodes, these other charge packets having been produced earlier by earlier input signals.

Typical voltages (with respect to substrate) of the various sources are, by way of illustration only, approximately as follows:

$V_0$ = 0 to 8 volts
$V_1$ = 11 volts
$V_2$ = 0 volt (ground)
$V_3$ = 17 volts
$V_{DD}$ = 17 volts
$V_{SG}$ = 8 volts
$V_{IG}$ = 5 volt passive, 13 volt active phase
$P_1$ = 5 volt passive, 13 volt active phase
$P_2$ = 5 volt passive, 17 volt active phase
$S$ = 9 volt ($\pm 2$ volt signal)

As further indicated in FIG. 5, the switching elements 64 and 65 are periodically kept closed during suitable "reset" intervals, to keep the split-electrodes at the desired potential. The switching elements 76 and 77 are also closed during these "reset" intervals plus for a short time interval thereafter during the active phase of $P_2$, in order to eliminate the reset noise (on the order of kTC) that results on lines 21 and 22 when the switching elements 34 and 35 are suddenly opened at the end of each "reset" interval. At this moment of time, the switching elements 76 and 77 are still closed, thus keeping the output of the difference amplifier 40 at the desired potential $V_0$. Even after the switching elements 76 and 77 have been opened, the respective reset noise voltages are stored across the capacitors 43 and 44, and the output of the amplifier 40 is still at $V_0$. Subsequently, the output signals of the CCD appear on lines 21 and 22, thereby applying corresponding signals on the input terminals of the amplifier 40 that are independent of the earlier kTC noise voltages.

It should be remarked that advantageously each of the capacitors 41 and 42 should be made in the form of a meandering or fingerlike electrode separated from the semiconductor substrate by the same sort of oxide layer as the split-electrodes. In addition, these electrodes for these capacitors are advantageously formed simultaneously with, and with the same sort of electrode material as that of, the split-electrodes and with the same electrode width; so that both of these capacitor electrodes will suffer from approximately the same misalignments as well as the same overetching and underetching (and hence the same corresponding capacitance changes) as the split-electrodes. In this way, one obtains better control over the overall filter gain (which depends upon the capacitance ratios of the capacitors 41 and 42 to the split-electrode systems of the CCD).

FIG. 4 illustrates a typical circuit diagram for the amplifier 60. Insulated gate field effect transistors (IGFETs) 402, 405, and 406, together with load IGFETs 403, and 404, and a current source 401 form a differential preamplifier stage feeding a pair of conventional cascaded operational amplifiers 407 and 408. Output lines 21 and 22 of the CCD feed signal to the gate electrodes of transistors 405 and 406, whereas the fixed D.C. voltage source $V_1$ is connected to the gate electrode of transistor 402. In this way, the negative feedback signal delivered to the node 61 is proportional to $V_1 - 1/2(V_{21} + V_{22})$, as desired in the amplifier 60. By virtue of this negative feedback, the potential on the same electrodes is restored, that is: $(V_{21} + V_{22})/2 = V_1$. Thereby the common mode signal ($V_{21} = V_{22}$) is eliminated.

Although the invention has been described in detail with respect to a specific embodiment, various modifications can be made without departing from the scope of the invention. For example, instead of the CCD input configuration of electrodes 302 and 303, the input arrangement for the CCD can take the form of the antialiasing input circuit described in my copending U.S. patent application Ser. No. 720,885, filed on Sept. 7, 1976. It should be understood, of course, that the various amplifiers, capacitors, and transistors in the sensing circuit 300 can all be advantageously integrated in the same semiconductor substrate as the CCD itself. It should be mentioned that in order to achieve linearity of output response vs. input signal in the CCD of FIG. 3, it is important that the electrode 304 and its underlying oxide be geometrically substantially identical to each of the split electrodes (with the spaces between each pair of electrode segments being matched to region 303.5, in order to minimize nonlinear distortions). Finally, it should be understood that instead of the CCD 20, a semiconductor bucket brigade device may be used.

What is claimed is:
1. Semiconductor apparatus which comprises
   (a) a charge transfer device for transferring charge in a semiconductor medium having first and second sets of sense electrodes, each said electrode located in proximity to a major surface of the medium for detecting the charge in the medium underlying each said electrode;
   (b) conducting means for electrically connecting together all of the electrodes of the first set to a first output terminal of said device and for connecting together all of the electrodes of the second set to a second output terminal of said device, said device also including at least one other separate electrode connected to a first reference terminal for connection to a first D.C. voltage source;
   (c) a first amplifier means, for suppressing common mode signals on the first and second sets of electrodes, having at least first and second input terminals of opposite summing polarity, said first input terminal being connected to said second output terminal of said device and said second input terminal being connected to said reference terminal for connection to the first D.C. voltage source, said first amplifier means having an output terminal electrically coupled through a feedback means to the second output terminal of said device; and
   (d) first and second electrical capacitors, one of which is electrically connected for coupling said first output terminal of said device to an output terminal of the first amplifier, and the other of which is connected for coupling said output terminal of the first amplifier to said second output terminal of said device.

2. Apparatus according to claim 1 which further includes a second amplifier means having first and second difference amplifier, input terminals of opposite summing polarity coupled respectively through first and second electrical coupling means to said first and second output terminals of said device, respectively.

3. Apparatus according to claim 2 in which an output terminal of the second amplifier means is coupled through a third electrical coupling means to the first output terminal of said device.

4. Apparatus according to claim 3 in which the second output terminal of said device is coupled through a fourth electrical coupling means to a second reference terminal for connection to a second reference potential.

5. Apparatus according to claim 4 in which the third and fourth coupling means are essentially third and fourth capacitors, respectively.

6. Apparatus according to claim 5 in which the capacitances of the first and second capacitors are substantially equal.

7. Apparatus according to claim 6 in which the capacitances of the first and second capacitors are mutually equal to within about 0.1% and are of the order of magnitude of one-half the sum of the capacitances of the first plus second sets of electrodes.

8. Apparatus according to claim 1 in which the capacitances of the first and second capacitors are equal to within about 0.1%.

9. Apparatus according to claim 5 in which the first and second coupling means are respectively fifth and sixth capacitors, and in which is provided first switching means for periodically connecting the first input terminal of the second amplifier to the output terminal of said second amplifier.

10. Apparatus according to claim 5 which further includes second electrical switching means for periodically connecting the first output terminal of said device to the second output terminal of said device.

11. Apparatus according to claim 1 in which the first amplifier means has at least three input terminals, the third of which is connected to said second output terminal of said device and has the same summing polarity as that of the said first input terminal of said first amplifier, and in which the first reference terminal for connection to the first D.C. voltage source is connected to an electrode for charge transfer in an input stage of the charge transfer device.

12. Apparatus according to claim 11 which further includes a second amplifier having first and second input terminals coupled respectively through first and second electrical coupling means to said first and second output terminals of said device, respectively.

13. Apparatus according to claim 12 in which an output terminal of the second amplifier is coupled through a third electrical coupling means to the first output terminal of said device.

14. Apparatus according to claim 13 in which the second output terminal of said device is coupled through a fourth electrical coupling means to a second reference terminal for connection to a second D.C. reference potential.

15. Apparatus according to claim 14 in which the third and fourth coupling means are essentially third and fourth capacitors, respectively.

16. Apparatus according to claim 15 in which the capacitances of the third and fourth capacitors are both of the order of magnitude of the difference in capacitance between the first and second sets of electrodes.

17. Apparatus according to claim 16 in which the capacitances of the first and second capacitors are both of the order of magnitude of one-half the sum of the capacitances of the first plus second sets of electrodes.

18. Apparatus according to claim 16 in which each of the capacitances of the first and second capacitors respectively is of the same order of magnitude as the respective capacitance of the first and second set of electrodes.

19. Apparatus according to claim 15 in which the first and second coupling means are respectively fifth and sixth capacitors, and in which is provided first switching means for periodically connecting the first input terminal of the second amplifier to the output terminal of said second amplifier.

20. Apparatus according to claim 19 which further includes second electrical switching means for periodically connecting the first output terminal of said device to the second output terminal of said device.

21. Semiconductor apparatus which comprises
   (a) a semiconductor device having first and second output terminals of said device characterized respectively by first and second characteristic device capacitances;

(b) a first amplifier means, for suppressing common mode signals at said device terminals, having a first input terminal of positive summing polarity for connection thereto of a first D.C. reference voltage and a second input terminal of negative summing polarity in said amplifier connected to the second output terminal of said device;

(c) first and second coupling means respectively for connecting an output terminal of the first amplifier respectively to the first and second output terminals of said device;

(d) a second amplifier means having first and second input terminals connected respectively through first and second electrical coupling means respectively to the first and second output terminals of said device; and (e) a third capacitor for coupling an output terminal of the second amplifier to the first output terminal of said device.

22. Apparatus according to claim 21 in which the first and second coupling means are essentially first and second capacitors, respectively.

23. Apparatus according to claim 21 which further includes a fourth capacitor for coupling the second output terminals of said device to a terminal for application thereto of a second D.C. reference potential.

24. Apparatus according to claim 22 in which the first amplifier has a third input terminal of said opposite summing polarity connected to the first output terminal of said device, such that the output of the first amplifier means is proportional to said first D.C. reference voltage less one-half the sum of first and second signal voltages respectively at said first and second output terminals of said device.

25. Apparatus according to claim 24 in which the capacitances of the first and second capacitors respectively are substantially mutually equal.

26. Apparatus according to claim 25 in which the capacitances of the first and second capacitors are both of the same order of magnitude as the sum of the first and second characteristic device capacitances.

* * * * *